United States Patent [19]
Dvir

[11] Patent Number: 6,078,539
[45] Date of Patent: Jun. 20, 2000

[54] METHOD AND DEVICE FOR INITIATING A MEMORY ARRAY DURING POWER UP

[75] Inventor: Ran Dvir, Kfar Saba, Israel

[73] Assignee: Saifun Semiconductors Ltd., Netanya, Israel

[21] Appl. No.: 09/244,445

[22] Filed: Feb. 4, 1999

[51] Int. Cl.[7] .................................................. G11C 7/00
[52] U.S. Cl. ................................... 365/226; 365/210
[58] Field of Search .............................. 365/226, 189.07, 365/210, 189.01

[56] References Cited

U.S. PATENT DOCUMENTS

| | | | |
|---|---|---|---|
| 5,289,412 | 2/1994 | Frary et al. | 365/210 |
| 5,946,258 | 8/1999 | Evertt et al. | 365/226 |
| 5,949,728 | 9/1999 | Liu et al. | 365/210 |

*Primary Examiner*—Son Mai
*Attorney, Agent, or Firm*—Skjerven, Morrill, MacPherson, Franklin & Friel LLP; Alan H. MacPherson

[57] ABSTRACT

The present invention is a device and method for a semiconductor array which attempts to ensure that, during power up, a reference cell becomes valid after one or more data cells. The array includes at least one data cell, at least one cell common line to which the data cell is connected, at least one reference cell, a reference common line to which the references cell is connected and a voltage differentiator. The voltage differentiator is connected to the cell and reference common lines and receives a powering-up power supply voltage from a power supply. The voltage differentiator provides a reference voltage to the reference common line and a cell voltage to the at least one cell common line, wherein the reference voltage is lower than the cell voltage by a predetermined voltage gap.

14 Claims, 9 Drawing Sheets

METHOD AND DEVICE FOR INITIATING A MEMORY ARRAY DURING POWER UP

FIELD OF THE INVENTION

The present invention relates to methods and devices for initiating a memory cell array, in general, and to methods and devices for determining the time period in which the data of a memory cell becomes valid, in particular.

BACKGROUND OF THE INVENTION

Latch based, non-volatile memory devices are known in the art. The basic element of such a device includes a non-volatile memory cell and a latch unit which is connected thereto. The latch unit provides an indication of the data which is stored in the cell by providing an output electrical signal.

When the memory device is initiated (such as during power-up), it is necessary to determine the time period after which the data contained therein is valid for retrieval. It is noted that during the initiation stage, the variations in the behavior of the device, due to its structure, the voltage levels provided thereto, as well as other environmental conditions, are not stable and induce considerable constraints over the process of validation of the content of the cells.

Reference is now made to FIG. 1 which is a schematic illustration of a plurality of data cells, generally referenced 10, and a reference cell, generally referenced 20, known in the art. The gate ends of data cells 10A, 10B, 10C and 10D and reference cell 20 are connected to a common line 18. Each of the data cells 10A, 10B, 10C and 10D are connected to a pair of terminal lines 12A–14A, 12B–14B, 12C–14C and 12D–14D, respectively. Reference cell 20 is connected to terminal lines 22 and 24.

Reference is further made to FIG. 2 which is a schematic illustration of a memory cell and latch device, known in the art. Latch device 50 includes two switching transistors 54 and 52, a capacitor 56, a latch formed of two inverters 60 and 62 (both powered by a power supply Vdd) and a transistor 68. The device 50 is connected to a memory cell, having a source 14, a drain 12 and a gate 18.

Inverter 60 is connected to capacitor 56, via line 58, and to the source of transistor 68, via line 64, facing the transistor 68. Inverter 62 is connected to capacitor 56, via line 58, and to the source of transistor 68, via line 64, facing the capacitor 56.

Switching transistor 52 is connected between the drain 12 of the memory cell and the ground. Switching transistor 54 is connected between source 14 of the memory cell and a line 58. Both switching transistors are activated by the same transfer signal which is provided by the system (not shown).

The capacitor 56 is further connected to the ground. The drain of the transistor 68 is also connected to the ground. The gate of the transistor 68 is connected to a voltage source (not shown) which is used to "clear" the device 50. The memory cell gate is connected to common line 18.

As the gate of the transistor 68 receives a "clear" signal, it connects line 64 to the ground, thereby decreasing the voltage level exhibited on line 64. As a result, inverter 62 inverts a low potential on line 64 to a high potential on line 58 and charges the capacitor 56. The current which is provided by inverter 62 is denoted $I_{CHARGE}$.

When switching transistors 52 and 56 are activated, cell 10 is connected to the rest of the device. As the gate voltage $V_{GATE}$ of cell 10 rises, cell 10 conducts electrical current ($I_{DISCHARGE}$) according to its programmed state, which is defined by its threshold voltage $V_T$. A programmed cell is characterized by a high threshold voltage and, as a result, when $V_{GATE}$ is applied thereto, the programmed cell hardly conducts charge ($I_{DISCHARGE} \ll I_{CHARGE}$). An erased cell, on the other hand, is characterized by a low threshold voltage which produces significant current ($I_{DISCHARGE} > I_{CHARGE}$) when $V_{GATE}$ is applied to the cell.

An erased cell, being able to conduct large currents, discharges the capacitor 56 to the ground, thereby yielding a ground potential over line 58. At this stage, the inverter 60 inverts the low potential over line 58 to high potential over line 64.

On the other hand, a programmed cell, being able to conduct only low currents, does not conduct enough current to discharge the capacitor 56 to the ground. Accordingly, the potential over line 58 remains high. At this stage, the potential over line 58 remains high and the inverter 60 maintains a low potential over line 64. Thus, the output of device 50 remains unchanged for a programmed cell.

It is noted that the inversion time $T_{INVERSION}$ which an erased cell takes to invert the output of device 50, after which the data of the output signal is considered "valid", varies for different possible values of the threshold voltage $V_T$ of the cell, the profile of $V_{GATE}$, the characteristics of the components of device 50, the speed at which the power supply Vdd rises and the like.

Hence, an additional mechanism is required for determining when the data at the output of the device 50 is valid for the content of such a cell. It is known in the art to use an additional cell (a reference cell) for determining the exact point in time when a conventional cell becomes valid. It is desired that the data cell become valid before the reference cell, so that the validity of the reference cell indicates the validity of the data cell.

The power up ramp rate primarily affects the speed at which the latch formed of inverters 60 and 62) initially charges capacitor 56 and the speed at which the gate voltage $V_{GATE}$ rises. Since cell 10 (whether as a data or a reference cell) must first overcome the voltage stored on capacitor 56 before device 50 can produce a valid signal, the power up ramp rate affects the ability of the cell to do so. For a given ramp rate, how quickly the cell can overcome the capacitor voltage is a function of the characteristics of the cell, both its charge transfer characteristics and its threshold voltage $V_T$.

The charge transfer characteristics of a cell are determined according to the cell tunnel width (W) and the cell tunnel length (L). With a low W/L ratio, the cell transfers charge slowly. Alternatively, with a high W/L ratio, the cell transfers charge quickly. Accordingly, in the prior art, the $(W/L)_{DATA}$ ratio of a data cell is set higher than the $(W/L)_{REFERENCE}$ of a reference cell. As a result, the drive current of the reference cells is smaller than the drive current of the data cells and the validity time period of a reference cell is generally longer than the validity time period of a data cell. It is common to set $$\frac{\left(\frac{W}{L}\right)_{REFERENCE}}{\left(\frac{W}{L}\right)_{DATA}} \approx \frac{2}{3}.$$

A cell basically operates in three modes, a cut off mode, a sub-threshold mode and a saturated strong inversion mode.

When the gate voltage $V_{GATE}$, provided to the cell, is significantly lower than the threshold voltage $V_T$ which characterizes the cell, the cell is in the cut-off ode. In the cut-off mode, the cell is in a state of high impedance and hence, has substantially no conductivity.

When the gate voltage $V_{GATE}$, is similar to the threshold voltage $V_T$ (i.e., $|V_{GATE}-V_T|<0.1$ volts), the cell is in the sub-threshold mode. In the sub-threshold mode, the cell is in a state of medium impedance and hence has substantially low conductivity.

When the gate voltage $V_{GATE}$ is higher than the threshold voltage $V_T$, the cell is in the saturated strong inversion mode. In the saturated strong inversion mode, the cell is in a state of low impedance and hence, has substantially high conductivity. It is noted that conventionally, $$\frac{I_{SATURATED-STRONG-INVERSION}}{I_{SUB-THRESHOLD}} > 10.$$

It is noted that both the data cell and the reference cell are provided with the same $V_{GATE}$ level (which varies with the power supply ramp rate) but the threshold level of the data cell $V_{T-DATA}$ can be different than the threshold level of the cell $V_{T-REF}$, due to variations in the manufacturing process, programming states, natural decay over a long period of time, and the like.

When $V_{T-REF}$ is lower than $V_{T-DATA}$, there is a strong probability that the reference cell will be the first to transform from the sub-threshold stage to the saturated strong inversion stage and become valid (i.e., complete the transfer of the predetermined amount of charge) before the data cell. It is noted that a reference cell with low W/L, in the saturated strong inversion mode, conducts significantly higher currents than a data cell with high W/L in the sub-threshold mode. Thus, depending on the factors described above, the reference cell might indicate that the data cell is valid when this is not the case. It will be appreciated by those skilled in the art that such a situation is totally undesirable.

SUMMARY OF THE PRESENT INVENTION

It is an object of the present invention to provide a device and method which attempts to ensure that, during power-up, reference cells become valid only after data cells do.

There is therefore provided, in accordance with a preferred embodiment of the present invention, an array which includes at least one data cell, at least one cell common line to which the data cell is connected, at least one reference cell, a reference common line to which the references cell is connected and a voltage differentiator. The voltage differentiator is connected to the cell and reference common lines and receives a powering-up power supply voltage from a power supply. The voltage differentiator provides a reference voltage to the reference common line and a cell voltage to the at least one cell common line, wherein the reference voltage is lower than the cell voltage by a predetermined voltage gap.

Moreover, in accordance with a preferred embodiment of the present invention, the voltage gap is defined as at least twice an expected threshold voltage variation of the cells.

Further, in accordance with a preferred embodiment of the present invention, the voltage differentiator includes first, second and third resistors and first and second current control units. The first resistor $R_1$ is connected to a powering up voltage source and to the gate of the data cell(s). The second resistor $R_2$ is connected to the powering-up voltage source and to the gate of the reference cell. The first current control unit is connected between the gate of the data cell and the ground and conducts an electrical current $I_{CELL}$ therebetween. The second current control unit is connected between the gate of the reference cell and the ground and conducts an electrical current $I'_{CELL}$ therebetween. The third resistor $R_3$ is connected between the gate of the reference cell and the ground. The first current control unit is further connected to the second current control unit, thereby essentially equating between $I'_{CELL}$ and $I_{CELL}$.

Still further, in accordance with a preferred embodiment of the present invention, the first current control unit includes a first N-type transistor and a P-type transistor and the second current control unit comprises a second N-type transistor. A source of the first N-type transistor and a source of the second N-type transistor are connected to the ground, a source of the P-type transistor is connected to the data cell, a drain of the second N-type transistor is connected to the reference cell and a gate of the second N-type transistor is connected to a gate and drain of the first N-type transistor and to a gate and drain of the P-type transistor.

Alternatively, in accordance with a preferred embodiment of the present invention, the device includes a voltage moderating unit connected between the voltage differentiator and a gate of the data cell and further connected between the voltage differentiator and a gate of the reference cell. The voltage moderating unit includes a unit which modulates the cell voltage V, thereby providing a moderated cell voltage V' to the gate of the data cell and a unit which modulates the reference voltage V, thereby providing a moderated reference voltage V' to the gate of the reference cell.

There is also provided, in accordance with a preferred embodiment of the present invention, a device for validating the content of at least one data cell. The device includes at least one reference cell, pre-set to be erased, and a voltage differentiator, connected to a gate of the data cell, to a gate of the reference cell and to a powering-up voltage source. The voltage differentiator receives a rising voltage $V_{DD}$ from the powering-up voltage source and provides a first voltage $V_{DATA}$ to the gate of the data cell and a second voltage $V_{REF}$ to the gate of the reference cell. The voltage differentiator maintains the second voltage $V_{REF}$ lower than the first voltage $V_{DATA}$, by at least a predetermined voltage gap $\Delta V$.

There is also provided, in accordance with a preferred embodiment of the present invention, a method for attempting to ensure that during power up of an array containing at least one latch cell and at least one latch reference cell, the at least one latch reference cell becomes valid after the at least one latch data cell. The method includes the steps of providing a first voltage signal $V_{DATA}$ to the gate of the latch data cell, providing a second voltage signal $V_{REF}$ to the gate of the latch reference cell and maintaining the second voltage signal $V_{REF}$ lower than the first voltage signal $V_{DATA}$ by at least a predetermined voltage gap $\Delta V$.

Further, in accordance with a preferred embodiment of the present invention, the method includes the step of modulating the first voltage signal $V_{DATA}$ and the second voltage signal $V_{REF}$.

Finally, in accordance with a preferred embodiment of the present invention, the method includes the steps of detecting a flip in the output of the latch of the reference cell and determining the validity of the data cell.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The present invention overcome the disadvantages of the prior art by attempting to ensure that, irrespective of the power supply ramp rate and the threshold levels $V_T$ of the reference and data cells, an inversion time $T_{INV-DATA}$ for a data cell is shorter than an inversion time $T_{INV-REF}$ for a reference cell.

Figure 3:
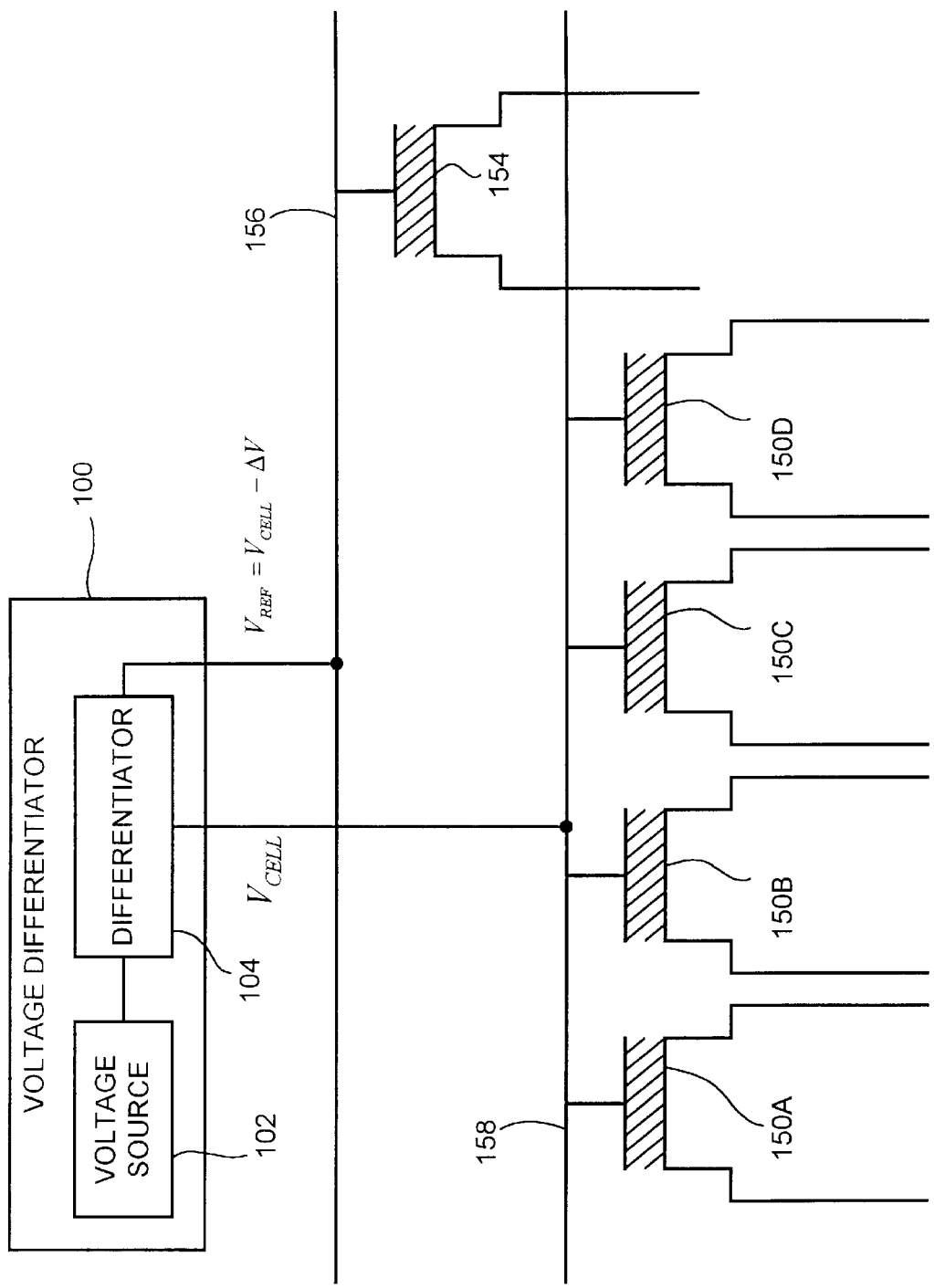
FIG. 3 is a schematic illustration of a device and a memory array, constructed and operative in accordance with a preferred embodiment of the present invention.
Figure 4A:
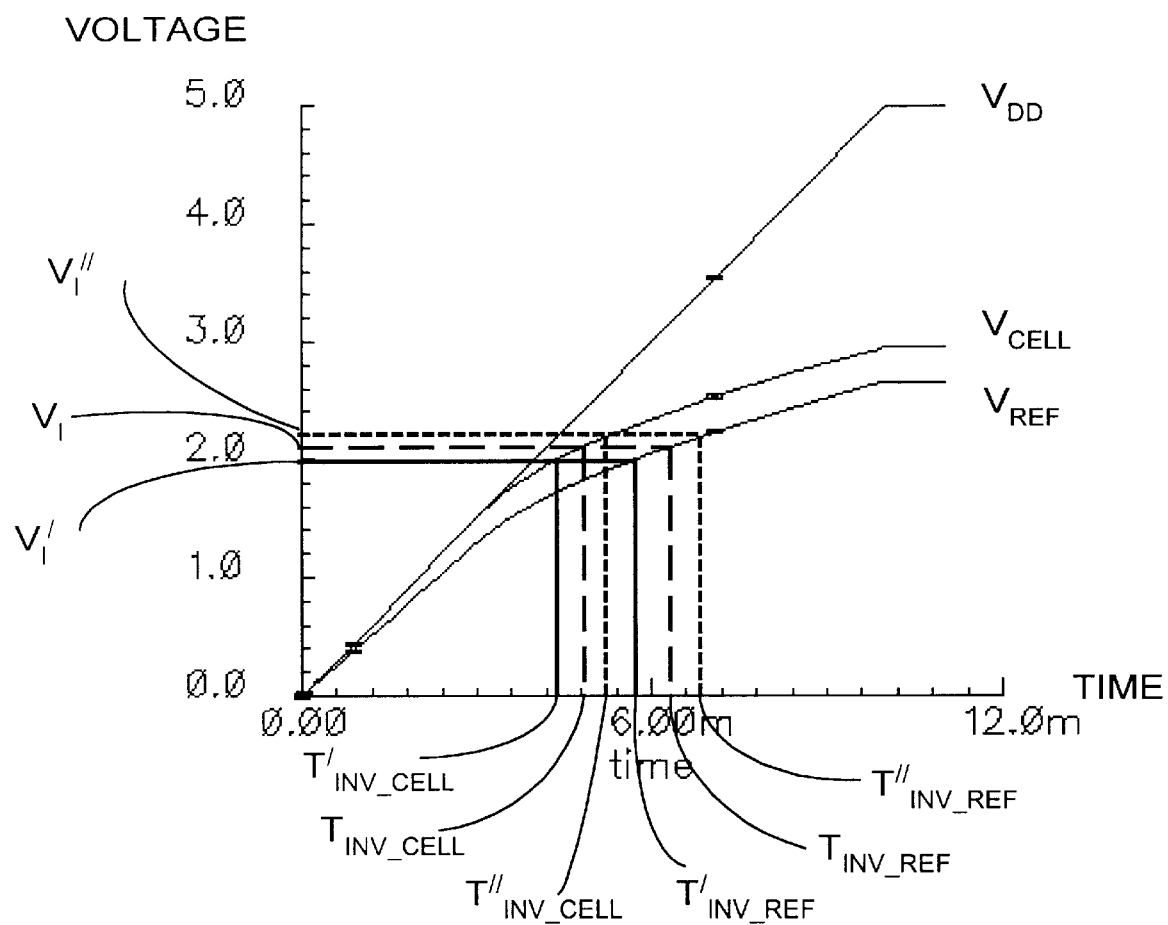
FIGS. 4A and 4B are graphical illustrations of a power-up signal and two signals which are functions of the power-up signal.
Figure 4B:
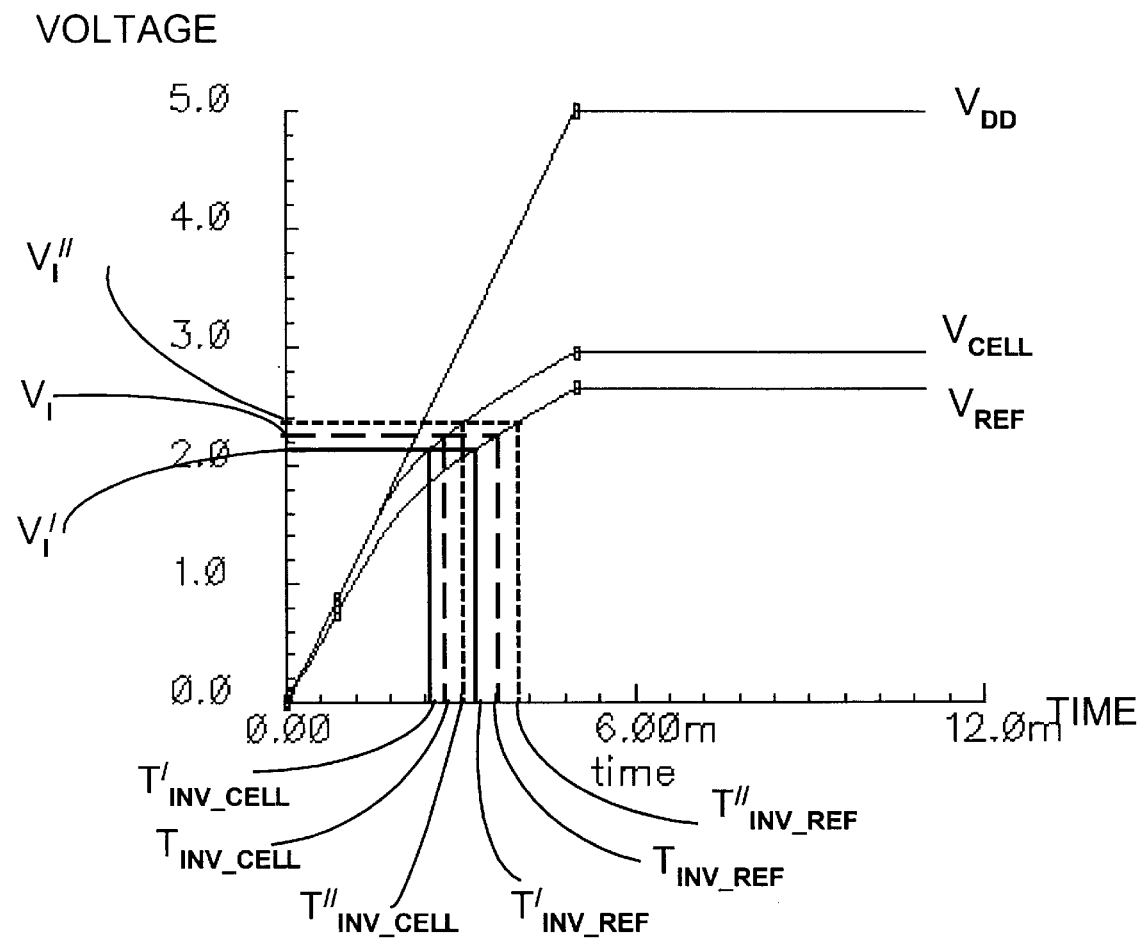

Reference is now made to FIG. 3, which is a schematic illustration of a device, generally referenced 100, and a memory array, constructed and operative in accordance with a preferred embodiment of the present invention. Reference is also made to FIGS. 4A and 4B which graphically illustrate the operation of the device of FIG. 3.

Figure 1:
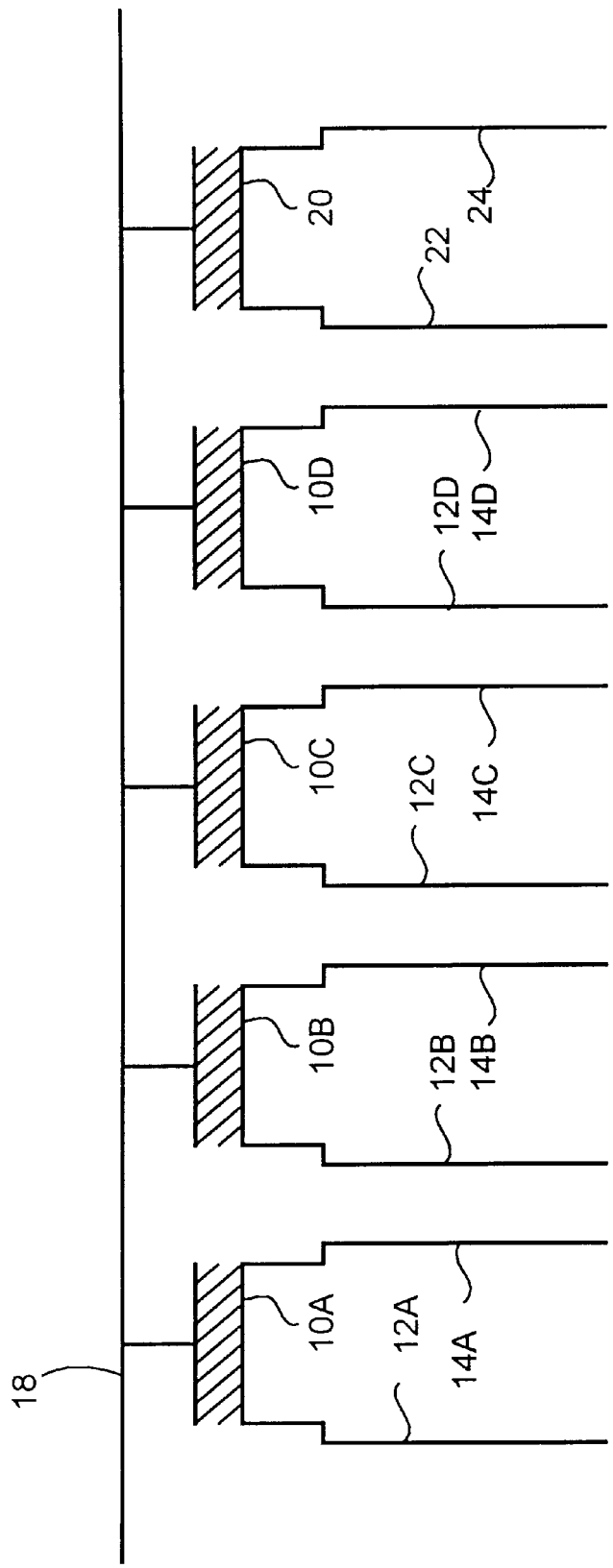
FIG. 1 is a schematic illustration of a plurality of data cells and a reference cell, known in the art.
Figure 2:
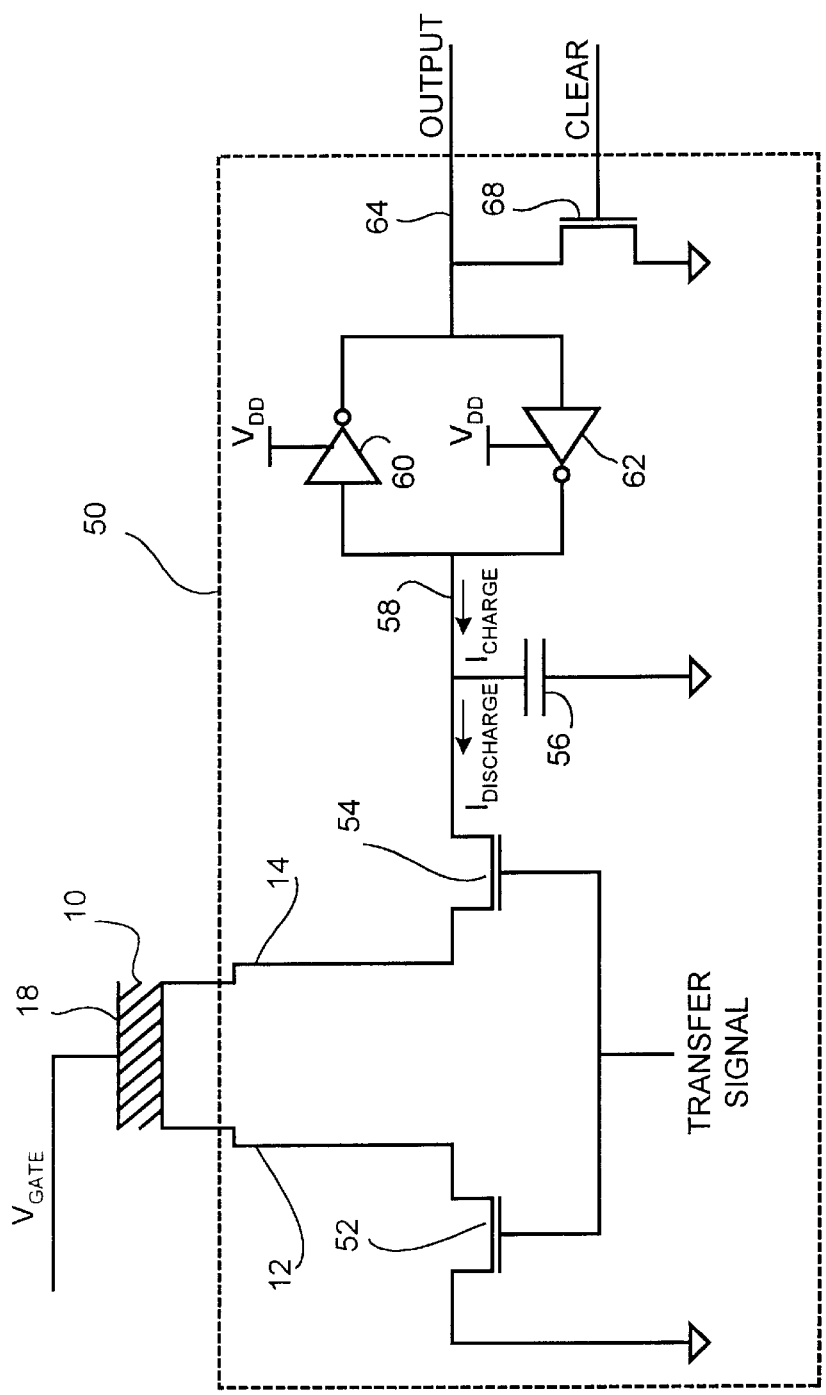
FIG. 2 is a schematic illustration of a memory cell and latch device, constructed and operative in accordance with another preferred embodiment of the present invention.

The cell array includes a plurality of cells 150A, 150B, 150C, 150D and 154. It is noted that, although not shown, each cell 150 and 154 is connected to a separate memory and latch device such as shown in FIG. 2.

Cell 154 is a reference cell and cells 150A, 150B, 150C, 150D are the data cells. Furthermore, all of cells 150 and 154 have the same W/L ratio. According to the present invention, reference cell 154 is located on a separate common line than the data cells, so that a different gate voltage can provided thereto. Accordingly, the gate of reference cell 154 is connected to common line 156 and the gates of data cells 150A, 150B, 150C, 150D are connected to common line 158.

Device 100 is a voltage differentiator which provides two voltage output signals, $V_{CELL}$ and $V_{REF}$. $V_{CELL}$ denotes the voltage which is provided to the gate of the data cells (common line 158) and $V_{REF}$ denotes the voltage which is provided to the gate of the reference cell (common line 156).

Device 100 includes a voltage source 102 and a differentiator 104 connected thereto. The voltage source 102 produces a voltage signal and provides it to the differentiator 104 which, in turn, produces data and reference gate voltage signals $V_{CELL}$ and $V_{REF}$, respectively.

As the memory device is powered-up, data gate voltage $V_{CELL}$ rises at a certain rate. According to the invention, differentiator 100 ensures that reference gate voltage $V_{REF}$ is continuously kept within a substantially fixed voltage difference lower than the $V_{CELL}$, such that $V_{REF}=V_{CELL}-\Delta V$, where $\Delta V$ is substantially constant.

There exist a plurality of criteria for setting the value of $\Delta V$. For example, a conventional cell is characterized by a threshold voltage level $V_T$ which is the point of transition from the sub-threshold mode to the saturated strong inversion mode. $V_{T-CELL}$ denotes the threshold voltage of a data cell and $V_{T-REF}$ denotes the threshold voltage of a reference cell. In the present invention, since the W/L ratio is the same for both types of cells, the threshold levels should be at the same level $V_T$. However, there is an expected variation in threshold levels of $\Delta V_T$ due to production differences, programming and erase cycling, natural decay and the like. Accordingly, it is desirable to set $\Delta V=2\Delta V_T$, so as to ensure that $V_{CELL}$ always reaches $V_{T-CELL}$ before $V_{REF}$ reaches $V_{T-REF}$.

FIGS. 4A and 4B are voltage vs. time graphs which show the voltage Vdd provided by the power supply, for two different ramp rates, and the resultant signals $V_{REF}$ and $V_{CELL}$. As discussed hereinabove, the signal $V_{REF}$ remains below the signal $V_{CELL}$ by a fixed amount.

FIGS. 4A and 4B also show the expected inversion voltage $V_I$ of the cells where the inversion voltage $V_I$ is the voltage at which device 50 with an erased cell inverts. The inversion voltage $V_I$ is the voltage at which the inversion time $T_{INVERSION}$ ends and is a function of the threshold voltage $V_T$ of the cell. FIGS. 4A and 4B also show two other inversion voltages $V_I'$ and $V_I''$ which are below and above desired inversion voltage $V_I$, respectively, but within the expected variation $\Delta V$.

As can be seen in FIGS. 4A and 4B, if both cells have the same inversion voltage $V_I$, then the device with the data cell will invert first, since $V_{CELL}$ reaches the inversion voltage $V_I$ first. Thus, FIGS. 4A and 4B show $T_{INV-CELL}$ of the data cells before the inversion time $T_{INV-REF}$ of the reference cell.

If, however, one of the inversion voltages is lower due to a lower threshold voltage, for example at the inversion voltage $V_I'$, the inversion time $T_{INV}$ for that device will be earlier than its inversion time at inversion voltage $V_I$. Alternatively, one of the inversion voltages might be higher, for example at the inversion voltage $V_I''$. If so, the inversion time $T_{INV}$ for that device will be after its inversion time at inversion voltage $V_I$. FIGS. 4A and 4B show the corresponding data and reference inversion times T'$_{INV-CELL}$, T'$_{INV-REF}$, T''$_{INV-CELL}$ and T''$_{INV-REF}$.

It is noted that all three data inversion times $T_{INV-CELL}$, T'$_{INV-CELL}$ and T''$_{INV-CELL}$ occur before any reference inversion time $T_{INV-REF}$, T'$_{INV-REF}$ or T''$_{INV-REF}$. Thus, in the present invention, as long as the inversion voltages remain between V''$_I$ and V'$_I$ (i.e. the difference in threshold voltages of reference and data cells is within the predetermined margin $\Delta V_T$), the device with the data cell will invert before the reference cell.

This relationship is true irrespective of which device has the lower threshold and thus, the lower inversion voltage and irrespective of power supply ramp rate as can be seen when comparing FIGS. 4A and 4B.

Figure 5:
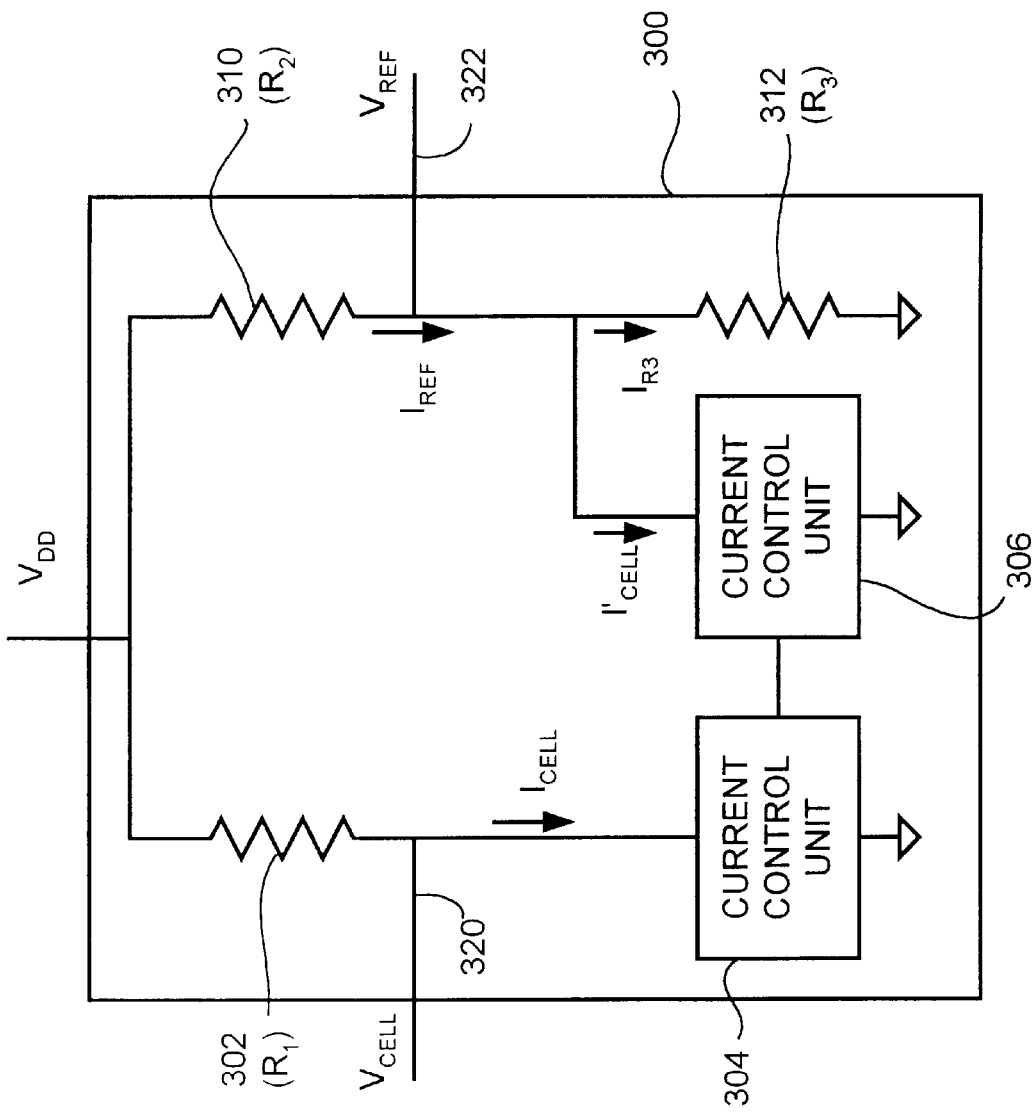
FIG. 5 is a schematic illustration of a voltage differentiator, constructed and operative in accordance with a further preferred embodiment of the present invention.

Reference is now made to FIG. 5 which is a schematic illustration of a voltage differentiator, generally referenced 300, constructed and operative in accordance with a further preferred embodiment of the present invention. Differentiator 300 includes three resistors 302 ($R_1$), 310 ($R_2$) and 312 ($R_3$) and two current control units 304 and 306.

Resistors 302 and 310 are connected to a voltage source (not shown), which provides a voltage signal $V_{DD}$. Resistor 302 is further connected to current control unit 304 and to an output line 320. Current control unit 304 is connected to current control unit 306.

The current control unit 306 is further connected to resistors 310 and 312 and to an output line 322. Current control units 304 and 306 are further connected to the ground. Resistor 312 is further connected to the ground.

Current control unit 304 maintains a current flow of $I_{CELL}$ and current control unit 306 maintains a current flow $I'_{CELL}$. According to the present invention, $I_{CELL}$ is substantially equal to $I'_{CELL}$ (i.e., $I_{CELL} \approx I'_{CELL}$). It is noted that, since there is a current flow of $I_{R3}$ through the resistor 312, hence $$I_{REF} = I'_{CELL} + I_{R3} > I_{CELL}$$

Resistor 302 has a resistance which is essentially equal to resistor 310. Accordingly, the voltage gap over the resistor 302 is smaller than the voltage gap over the resistor 310 (i.e., $V_{R1} < V_{R2}$). Thus, $$V_{CELL} = V_{DD} - V_{R1} \text{ and } V_{REF} = V_{DD} - V_{R2}. \text{ Hence } V_{REF} < V_{CELL}.$$

Figure 6:
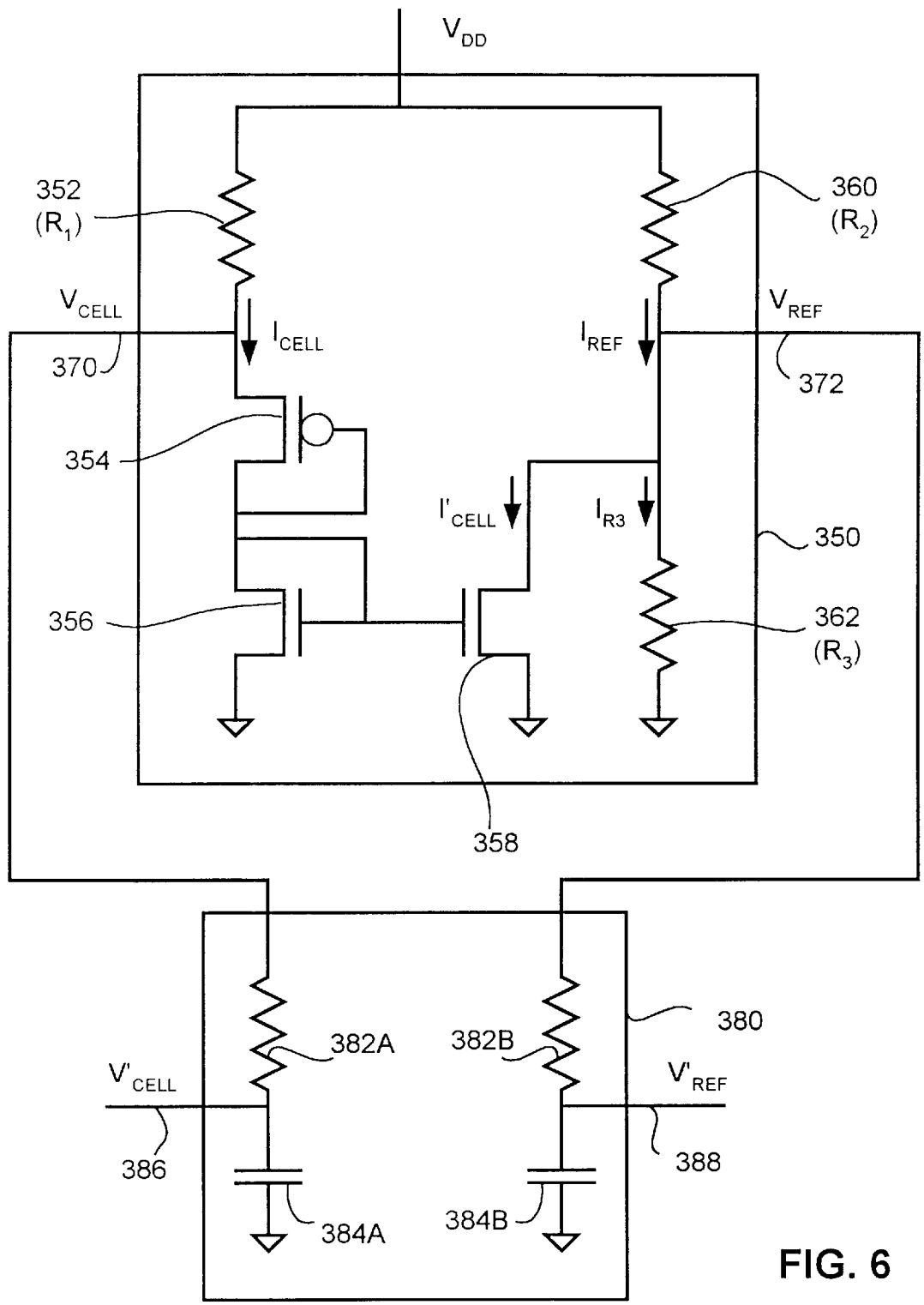
FIG. 6 is a schematic illustration of a voltage differentiator, constructed and operative in accordance with another preferred embodiment of the present invention.

Reference is now made to FIG. 6 which is a schematic illustration of a voltage differentiator, generally referenced 350, and a voltage rise moderator, generally referenced 380, both constructed and operative in accordance with another preferred embodiment of the present invention. Differentiator 350 includes three resistors 352 ($R_1$), 360 ($R_2$) and 362 ($R_3$), two N-type transistors 356 and 358 and a P-type transistor 354.

Resistors 352 and 360 are connected to a voltage source (not shown) which provides a voltage signal $V_{DD}$. Resistor 352 is further connected to the source end of transistor 354 and to an output line 370. The gate and drain of transistor 354 are connected to the gate and drain of transistor 356, as well as to the gate of transistor 358.

The drain of transistor 358 is connected to resistors 360 and 362 and to an output line 372. The source of transistors 356 and 358 are connected to the ground. Resistor 362 is further connected to the ground.

Figure 7A:
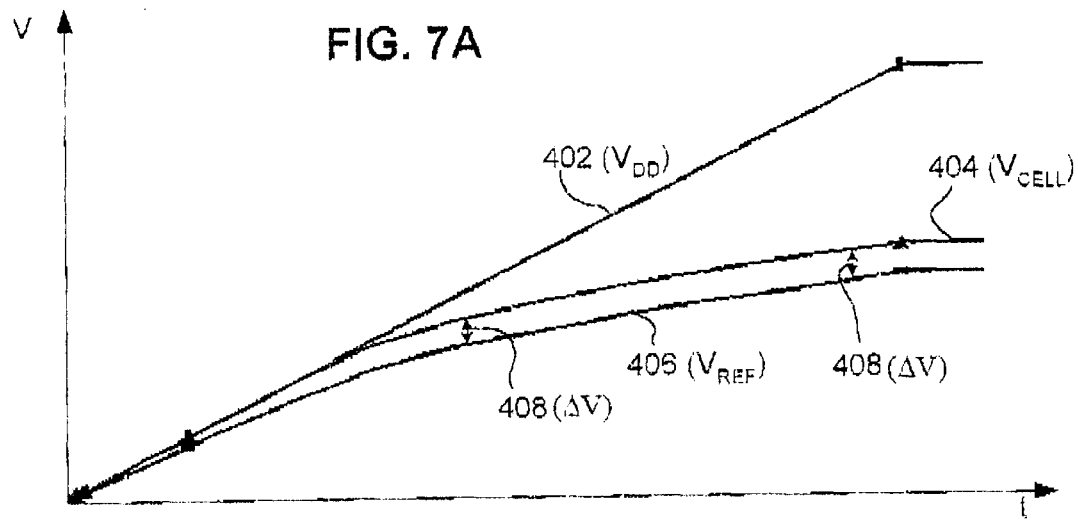
FIG. 7A is a voltage versus time diagram, which illustrates the voltage behavior at selected points in device of FIG. 5.
Figure 7B:
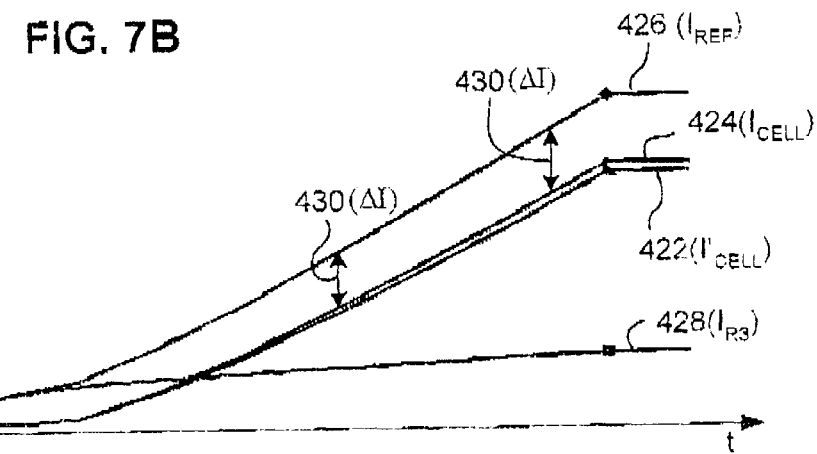
FIG. 7B is an electrical current versus time diagram, which illustrates the electrical current behavior at selected points in device of FIG. 5.

Reference is further made to FIGS. 7A and 7B. FIG. 7A is a voltage versus time diagram which illustrates the voltage behavior at selected points in device 350. FIG. 7B is an electrical current versus time diagram which illustrates the electrical current behavior at selected points in device 350.

Transistors 354 and 356 operate as diodes which moderate a current flow $I_{CELL}$ (reference 424 in FIG. 7B) through resistor 352. Transistor 358, being gate to gate connected to transistor 356, maintains a current flow of $I'_{CELL}$ (reference 422 in FIG. 7B) therethrough (it is noted that $I_{CELL} \approx I'_{CELL}$)

The resistor 362 maintains a current flow $I_{R3}$ (reference 428 in FIG. 7B) therethrough. It is noted that $I_{R3}$ is substantially constant but still exhibits a moderate rise over time, which affects $I_{REF}$. According to the present invention, the resistance of $R_2$ is set slightly higher than the resistance of $R_1$, so as to slightly reduce $I_{REF}$, thereby compensating for the moderate rise in $I_{R3}$. Finally we obtain:

$$I_{REF} = I'_{CELL} + I_{R3} > I_{CELL}.$$

Since $I_{CELL}$ and $I'_{CELL}$ rise at approximately at the same rate and $I_{R3}$ is substantially constant, the electrical current gap $\Delta I$ (reference 430 in FIG. 7B), is substantially maintained constant.

Through common calculations we obtain that $$V_{R2} = R_2 I_{REF} = R_2(I'_{CELL} + I_{R3}) > R_1 I_{CELL} = V_{R1}$$

$$V_{CELL} = V_{DD} - V_{R1} > V_{DD} - V_{R2} = V_{REF}$$

$$V_{CELL} - V_{REF} = V_{R2} - V_{R1} = R_2(I'_{CELL} + I_{R3}) - R_1 I_{CELL}$$

$$\approx R_2 I_{R3} = \Delta V$$

With reference to FIG. 7A, reference 402 denotes $V_{DD}$, reference 404 denotes $V_{CELL}$, reference 406 denotes $V_{REF}$ and reference 408 denotes the voltage gap $\Delta V$ between $V_{CELL}$ and $V_{REF}$.

Since $I_{R3}$ is substantially constant, hence $$\Delta V = V_{CELL} - V_{REF} \approx \text{Constant}.$$

It is noted that the method of the present invention is also applicable to verify the content of a cell right after it is programmed or erased, by simulating a power-up procedure.

When the profile of the incoming $V_{DD}$ signal cannot be predicted, there is a probability that the rise of $V_{DD}$ will be too sudden, like a step function. Such a sudden rise proportionally affects the output voltage signals $V_{CELL}$ and $V_{REF}$. The present invention provides a mechanism which prevents a sudden rise in the voltage signals that are provided to the data cell and the reference cell.

Referring back to FIG. 6, voltage rise moderating unit 380 includes two resistors 382A and 382B and two capacitors 384A and 384B. Capacitor 384A is connected between the ground, on one side, and the resistor 382A and an output line 386, on the other side. Output line 386 is further connected to a common line which is connected to at least one data cell (not shown). Capacitor 384B is connected between the ground, on one side, and the resistor 382B and an output 388, on the other side. Output 388 is further connected to a common line which is connected to at least one reference cell (not shown). The other end of resistor 382A is connected to output line 370, which provides voltage signal $V_{CELL}$. The other end of resistor 382B is connected to output line 372, which provides voltage signal $V_{REF}$. It is noted that unit 380 is connected between device 350 and the respective cells.

Each of the resistor capacitor pairs acts like a damper for the respective incoming signal. Resistor 382A and capacitor 384A act as a damper for voltage signal $V_{CELL}$, thereby producing an output $V'_{CELL}$.

Accordingly, even if $V_{CELL}$ rises as a step function, moderator 300 ensures that $V'_{CELL}$ rises more slowly with a moderate slope. The same applies for $V_{REF}$ and $V'_{REF}$, respectively.

Figure 8:
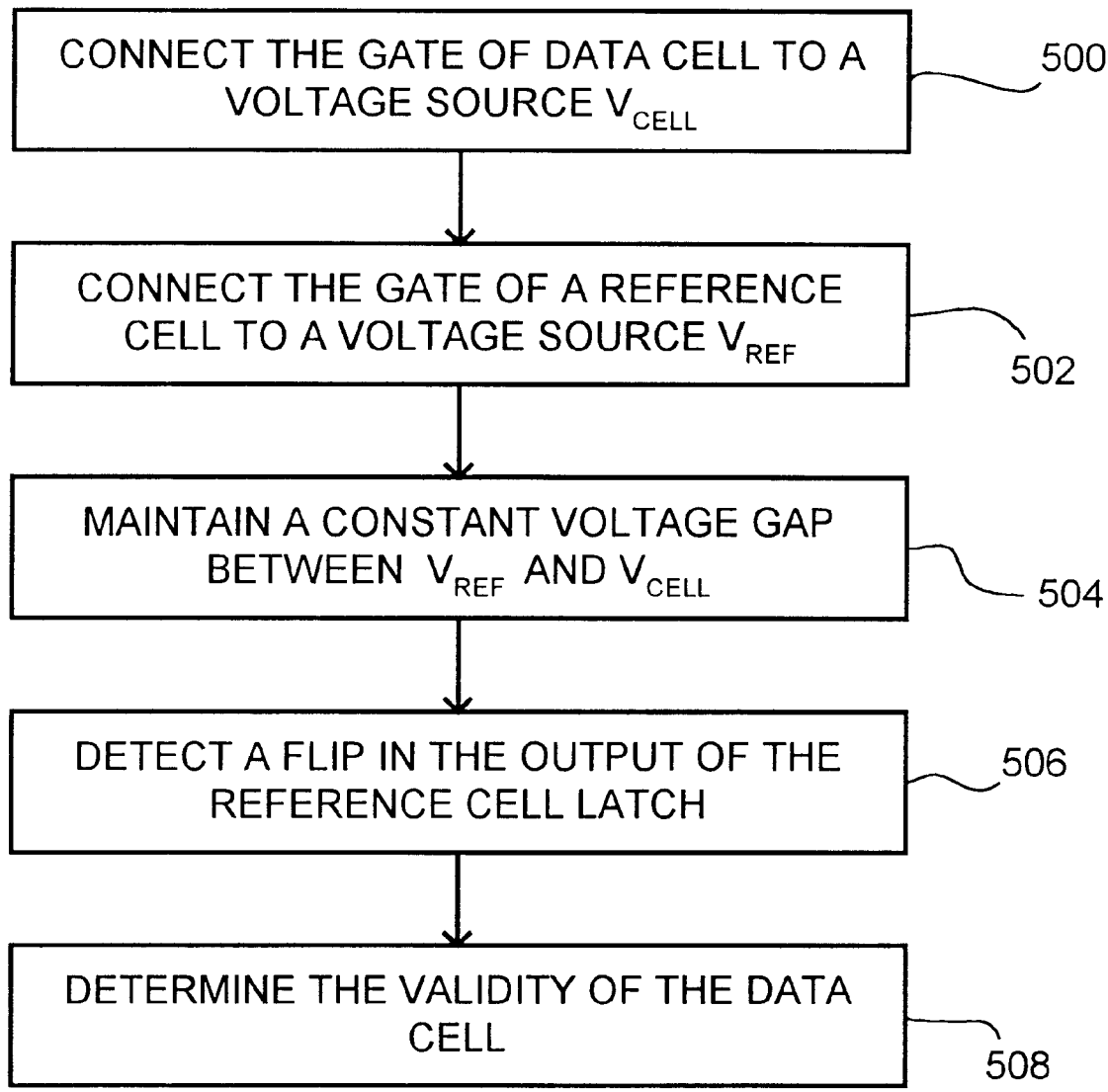
FIG. 8 is a schematic illustration of a method for operating a validation mechanism, operative in accordance with another preferred embodiment of the present invention.

Reference is now made to FIG. 8, which is a schematic illustration of a method for operating a validation mechanism, constructed and operative in accordance with another preferred embodiment of the present invention.

In step 500, the gate of a data cell is connected to a voltage source which provides a rising voltage $V_{CELL}$.

In step 502, the gate of a reference cell is connected to a voltage source which provides rising voltage $V_{REF}$.

In step 504, a substantially constant voltage gap $\Delta V$ is maintained between $V_{CELL}$ and $V_{REF}$, wherein $V_{CELL} - V_{REF} \approx \Delta V$.

In step 506, a flip in the output of the reference cell latch is detected. This flip indicates that the reference cell is valid and further indicates that the data cell is valid.

In step 508, the validity of the data cell is determined.

It will be appreciated by persons skilled in the art that the present invention is not limited to what has been particularly shown and described hereinabove. Rather the scope of the present invention is defined only by the claims which follow.

What is claimed is:

1. A semiconductor array comprising:

at least one data cell;

at least one cell common line to which said at least one data cell is connected;

at least one reference cell;

a reference common line to which said at least one references cell is connected; and a voltage differentiator, connected to said cell and reference common lines, for receiving a powering-up power supply voltage from a power supply and for providing a reference voltage to said reference common line and a cell voltage to said at least one cell common line, wherein said reference voltage is lower than said cell voltage by a predetermined voltage gap.

2. The array according to claim 1, wherein said voltage gap is defined as at least twice an expected threshold voltage variation of said cells.

3. The array according to claim 1, wherein said voltage differentiator comprises:

a first resistor $R_1$, connected to a powering up voltage source and to the gate of said at least one data cell;

a second resistor $R_2$, connected to said powering-up voltage source and to the gate of said at least one reference cell;

a first current control unit connected between said gate of said at least one data cell and the ground, for conducting an electrical current $I_{CELL}$ therebetween;

a second current control unit connected between said gate of said at least one reference cell and the ground, conducting an electrical current $I'_{CELL}$ therebetween, a third resistor $R_3$, connected between said gate of said at least one reference cell and the ground;

wherein said first current control unit is further connected to said second current control unit, thereby essentially equating between $I'_{CELL}$ and $I_{CELL}$.

4. The array according to claim 3, wherein said first current control unit comprises a first N-type transistor and a P-type transistor, and wherein said second current control unit comprises a second N-type transistor, wherein a source of said first N-type transistor and a source of said second N-type transistor are connected to the ground, a source of said P-type transistor is connected to said at least one data cell, a drain of said second N-type transistor is connected to said at least one reference cell, and wherein a gate of said second N-type transistor is connected to a gate and drain of said first N-type transistor and to a gate and drain of said P-type transistor.

5. The array according to claim 1, further comprising a voltage moderating unit, connected between said voltage differentiator and a gate of said at least one data cell, and further connected between said voltage differentiator and a gate of said at least one reference cell, wherein said voltage moderating unit includes means for modulating said cell voltage V, thereby providing a moderated cell voltage V' to said gate of said at least one data cell, and wherein said voltage moderating unit further includes means for modulating said reference voltage V, thereby providing a moderated reference voltage V' to said gate of said at least one reference cell.

6. A device for validating the content of at least one data cell, the device comprising:

at least one reference cell, pre-set to be erased, and a voltage differentiator, connected to a gate of said at least one data cell, to a gate of said at least one reference cell and to a powering-up voltage source, wherein said voltage differentiator receives a rising voltage $V_{DD}$ from said powering-up voltage source, wherein said voltage differentiator provides a first voltage $V_{DATA}$ to said gate of said at least one data cell and a second voltage $V_{REF}$ to said gate of said at least one reference cell, wherein said voltage differentiator maintains said second voltage $V_{REF}$ lower than said first voltage $V_{DATA}$, by at least a predetermined voltage gap $\Delta V$.

7. The array according to claim 6, wherein said voltage gap $\Delta V$ is determined as at least twice an expected threshold voltage variation of said cells.

8. The array according to claim 6, wherein said voltage differentiator comprises:

a first resistor $R_1$, connected to a powering-up voltage source and to the gate of said at least one data cell;

a second resistor $R_2$, connected to said powering-up voltage source and to the gate of said at least one reference cell;

a first current control unit connected between said gate of said at least one data cell and the ground, conducting an electrical current $I_{CELL}$ there between;

a second current control unit connected between said gate of said at least one reference cell and the ground, for conducting an electrical current $I'_{CELL}$ there between, a third resistor $R_3$, connected between said gate of said at least one reference cell and the ground;

wherein said first current control unit is further connected to said second current control unit, thereby essentially equating between $I'_{CELL}$ and $I_{CELL}$.

9. The array according to claim 8, wherein said first current control unit comprises a first N-type transistor and a P-type transistor, and wherein said second current control unit comprises a second N-type transistor, wherein a source of said first N-type transistor and a source of said second N-type transistor are connected to the ground, a source of said P-type transistor is connected to said at least one data cell, a drain of said second N-type transistor is connected to said at least one reference cell, and wherein a gate of said second N-type transistor is connected to a gate and drain of said first N-type transistor and to a gate and drain of said P-type transistor.

10. The array according to claim 6, further comprising a voltage moderating unit, connected between said voltage differentiator and a gate of said at least one data cell, and further connected between said voltage differentiator and a gate of said at least one reference cell, wherein said voltage moderating unit includes means for modulating said cell voltage V, thereby providing a moderated cell voltage V' to said gate of said at least one data cell, and wherein said voltage moderating unit further includes means for modulating said reference voltage V, thereby providing a moderated reference voltage V' to said gate of said at least one reference.

11. In an array containing at least one latch cell and at least one latch reference cell, a method for attempting to ensure that during power up, the at least one latch reference cell becomes valid after the at least one latch data cell, the method comprising the steps of:

provinding a first voltage signal $V_{DATA}$ to the gate of said at least one latch data cell;

providing a second voltage signal $V_{REF}$ to the gate of said at least one latch reference cell; and maintaining said second voltage signal $V_{REF}$ lower than said first voltage signal $V_{DATA}$ by at least a predetermined voltage gap $\Delta V$.

12. The method according to claim 11, further comprising the step of modulating said first voltage signal $V_{DATA}$ and said second voltage signal $V_{REF}$.

13. In an array containing at least one latch cell and at least one latch reference cell, a method for determining the validity of the at least one latch data cell during power up, the method comprising the steps of:

providing a first voltage signal $V_{DATA}$ to the gate of said at least one latch data cell;

providing a second voltage signal $V_{REF}$ to the gate of said at least one latch reference cell;

maintaining a said second voltage signal $V_{REF}$ lower than said first voltage signal $V_{DATA}$ by at least a predetermioned voltage gap $\Delta V$;

detecting a flip in the output of the latch of said at least one reference cell; and determining the validity of said at least one data cell.

14. The method according to claim 13, further comprising the step of modulating said first voltage signal $V_{DATA}$ and said seconod voltage signal $V_{REF}$.

* * * * *